US011557328B2

(12) United States Patent
Deshpande et al.

(10) Patent No.: US 11,557,328 B2
(45) Date of Patent: Jan. 17, 2023

(54) SIMULTANEOUS WRITE AND SEARCH OPERATION IN A CONTENT ADDRESSABLE MEMORY

(71) Applicant: MEDIATEK Singapore Pte. Ltd., Singapore (SG)

(72) Inventors: Chetan Deshpande, San Jose, CA (US); Gajanan Sahebrao Jedhe, San Jose, CA (US); Ritesh Garg, San Jose, CA (US); Gaurang Prabhakar Narvekar, San Jose, CA (US)

(73) Assignee: MEDIATEK Singapore Pte. Ltd., Singapore (SG)

( * ) Notice: Subject to any disclaimer, the term of this patent is extended or adjusted under 35 U.S.C. 154(b) by 0 days.

(21) Appl. No.: 17/193,853

(22) Filed: Mar. 5, 2021

(65) Prior Publication Data

US 2021/0295885 A1 Sep. 23, 2021

(30) Foreign Application Priority Data

Mar. 23, 2020 (IN) .............................. 202021012615

(51) Int. Cl.
*G11C 7/10* (2006.01)
*G11C 15/04* (2006.01)
*G11C 7/22* (2006.01)

(52) U.S. Cl.
CPC ............ *G11C 7/1045* (2013.01); *G11C 7/106* (2013.01); *G11C 7/1063* (2013.01);
(Continued)

(58) Field of Classification Search
CPC ................................. G11C 7/1045; G11C 7/10
(Continued)

(56) References Cited

U.S. PATENT DOCUMENTS 5,319,590 A * 6/1994 Montoye ................ G11C 15/04
365/189.07
6,362,990 B1 * 3/2002 Gibson ................... G11C 15/00
365/230.03
(Continued)

FOREIGN PATENT DOCUMENTS

EP 1 083 572 A1 3/2001
TW I462101 B 11/2014

OTHER PUBLICATIONS

Extended European Search Report dated Jul. 5, 2021 in connection with European Application No. 21162879.7.

*Primary Examiner* — Muna A Techane
(74) *Attorney, Agent, or Firm* — Wolf, Greenfield & Sacks, P.C.

(57) ABSTRACT

A ternary content addressable memory (TCAM) device comprising an input interface having a first input for receiving first data and a second input for receiving second data; and a memory configured to write the first data into an address selected row of the memory at the same time that a comparison is performed between the second data and at least one other row of the memory different from the address selected row. More particularly, the input interface may further have a third input for receiving a search enable signal and a fourth input for receiving a write enable signal, wherein the memory is configured to write the first data and perform the comparison in response to assertion of the search enable signal at the same time as assertion of the write enable signal. An associated method is also provided.

22 Claims, 13 Drawing Sheets

(52) U.S. Cl.
CPC ............ *G11C 7/1087* (2013.01); *G11C 7/222* (2013.01); *G11C 15/04* (2013.01)

(58) Field of Classification Search
USPC .................................................. 365/189.011
See application file for complete search history.

(56) References Cited

U.S. PATENT DOCUMENTS

| | | | |
|---|---|---|---|
| 6,839,256 B1 | 1/2005 | Proebsting et al. | |
| 8,347,019 B2* | 1/2013 | Bueti | G06F 13/4059 710/316 |
| 8,837,188 B1* | 9/2014 | Krishnamurthy | G11C 15/00 365/49.1 |
| 9,418,741 B1* | 8/2016 | Ramaraju | G11C 15/04 |
| 2005/0152167 A1* | 7/2005 | Nishiyama | G11C 15/00 365/49.17 |
| 2010/0110744 A1* | 5/2010 | El Baraji | G11C 11/1659 365/50 |

* cited by examiner

1

SIMULTANEOUS WRITE AND SEARCH OPERATION IN A CONTENT ADDRESSABLE MEMORY

CROSS-REFERENCE TO RELATED APPLICATIONS

This application claims priority to and the benefit of Indian Application No. 202021012615, filed Mar. 23, 2020 and entitled "SIMULTANEOUS WRITE OPERATION IN A CONTENT ADDRESSABLE MEMORY," which is hereby incorporated herein by reference in its entirety.

BACKGROUND

Content-addressable memory (CAM) is a type of computer memory that is specifically designed for search-intensive applications. Some CAMs are designed to search their entire contents in a single clock cycle. Data stored in a CAM can be accessed by searching for the data itself, and the memory retrieves the addresses where that data is located. Because of its parallel nature, CAMs are much faster than random access memory (RAM) architectures for searching. CAMs are often used in internet routers and switches, where they increase the speed of route lookup, packet classification and packet forwarding.

SUMMARY

Some aspects relate to a ternary content addressable memory (TCAM) device. The TCAM device has an input interface having a first input for receiving first data and a second input for receiving second data and a memory configured to write the first data into an address selected row of the memory at the same time that a comparison is performed between the second data and at least one other row of the memory different from the address selected row.

The first input may be a memory write bus.

The second input may be a search data bus.

The input interface may have a third input for receiving a search enable signal and a fourth input for receiving a write enable signal, wherein the memory is configured to write the first data and perform the comparison in response to assertion of the search enable signal at the same time as assertion of the write enable signal.

The TCAM may further comprise an internal write data bus configured to receive the first data; and an internal search data bus configured to receive the second data.

The TCAM may further comprise an input data buffer including a first storage device configured to receive the first data and provide the first data to the internal write data bus; and a second storage device configured to receive the second data and provide the second data to the internal search data bus.

The first storage device may comprise a latch or a flip-flop.

The TCAM device may further comprise circuitry configured to disable a HIT output corresponding to an entry of the memory being updated.

The circuitry comprises a decoder that receives an address of the entry being updated and a plurality of AND gates.

The TCAM device may be further configured to perform data and mask write operations in a single clock cycle.

The at least one other row may comprise a plurality of rows.

The plurality of rows may comprise all rows of the memory.

Some aspects relate to a method of operating a ternary content addressable memory (TCAM) device. The method includes the steps of receiving, at an input interface, first data via a first input and second data via a second input; and writing the first data into an address selected row of a memory at the same time as performing a comparison between the second data and at least one other row of the memory different from the address selected row.

The first input may be a memory write bus.

The second input may be a search data bus.

The method of operating the TCAM device may further comprise receiving a search enable signal and a write enable signal; and writing the first data and performing the comparison in response to assertion of the search enable signal at the same time as assertion of the write enable signal.

The method may further comprise receiving the first data at an internal write data bus; and receiving the second data at an internal search data bus.

The method may also comprise: by a first storage device, receiving the first data and providing the first data to the internal write data bus; and by a second storage device, receiving the second data and providing the second data to the internal search data bus.

The first storage device may comprise a latch or a flip-flop.

The method may further comprise disabling a HIT output corresponding to an entry of the memory being updated.

The disabling may be performed by circuitry comprising a decoder that receives an address of the entry being updated and a plurality of AND gates.

The method may further comprise performing data and mask write operations in a single clock cycle.

The at least one other row may comprise a plurality of rows.

The plurality of rows may be all rows of the memory.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION

Content-addressable memory (CAM) such as Ternary Content Addressable Memory (TCAM) can be used in high performance enterprise and data center switching ASICs (both embedded and standalone) to perform packet classification and forwarding. TCAM can enable high throughput classification by performing fast and parallel look ups by matching incoming packet headers with predefined rules stored in Access Control Lists (ACLs) look up tables. ACL look up table rules may be updated periodically to adapt to changing network traffic patterns. In some cases, to preserve priority of rules, a rule update in memory will result in shuffling many entries. In conventional systems, the lookup operation is paused while the rules are updating in the memory, resulting in a performance limitation.

The inventors have recognized and appreciated that the performance of such systems and operations may be improved by designing a TCAM that can perform entry updates in the background while continuing to search other entries. The inventors have developed techniques and circuitry that can perform both the look up operation and the rule update operation simultaneously, for example, in a single clock cycle.

Figure 1A:
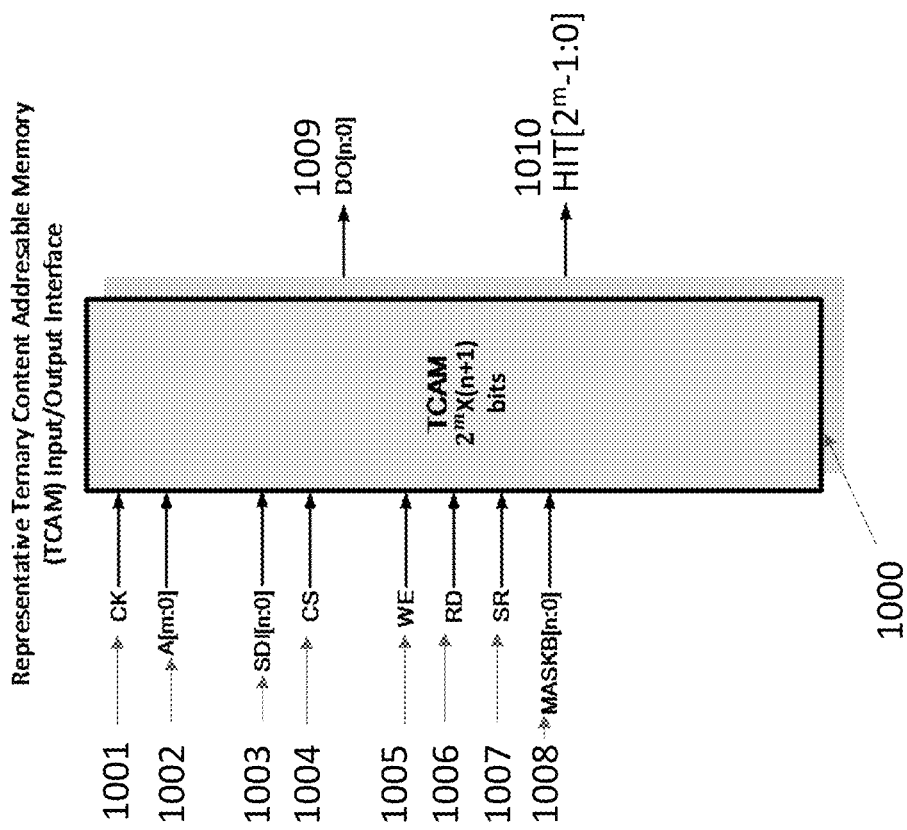
FIG. 1A is an exemplary diagram of a representative ternary content addressable memory, according to conventional systems.

FIG. 1A is an exemplary diagram of a ternary content addressable memory (TCAM) 1000. A TCAM may have '$2^{m+1}$' (m>0) number of rows, and 'n+1' columns, each of the rows comprising 'n+1' TCAM cells. TCAM 1000 receives inputs including clock signal CK 1001, input memory address bus A[m:0] 1002, input search bus SDI[n:0] 1003, chip select (CS) 1004, write enable (WE) 1005, read (RD) 1006, search (SR) 1007 and mask data bus MASKB[n:0] 1008.

Input memory address bus A[m:0] 1002 may indicate which of the $2^m$ TCAM entries to write into memory. Input search bus SDI[n:0] 1003 may represent the data used to search the memory array during a search operation. WE 1005 is an input to enable a memory write operation. RD 1006 is an input to enable a memory read operation. SR 1007 is an input to enable a search operation.

Figure 1B:
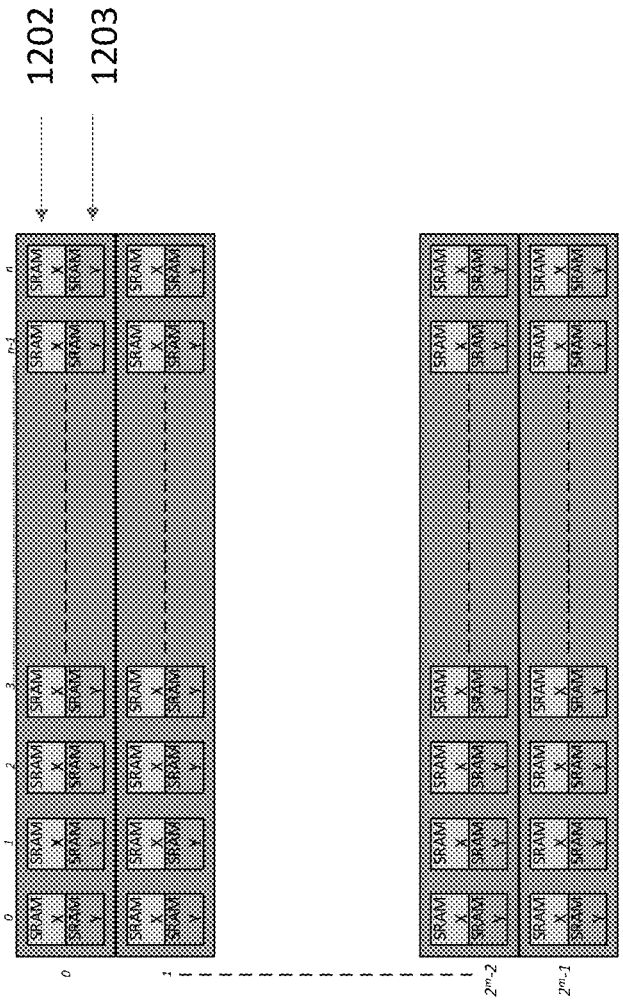
FIG. 1B is an exemplary diagram of a TCAM entry, according to some embodiments.

FIG. 1B is an exemplary diagram of TCAM entries, according to some embodiments. TCAM entries may be organized by masks. Accordingly, in some embodiments, in order to update a TCAM entry, both the data and mask of the entry may be updated. In FIG. 1B, SRAM X word 1202, representing data, and SRAM Y word 1203, representing the mask, may both need to be updated.

Figure 2:
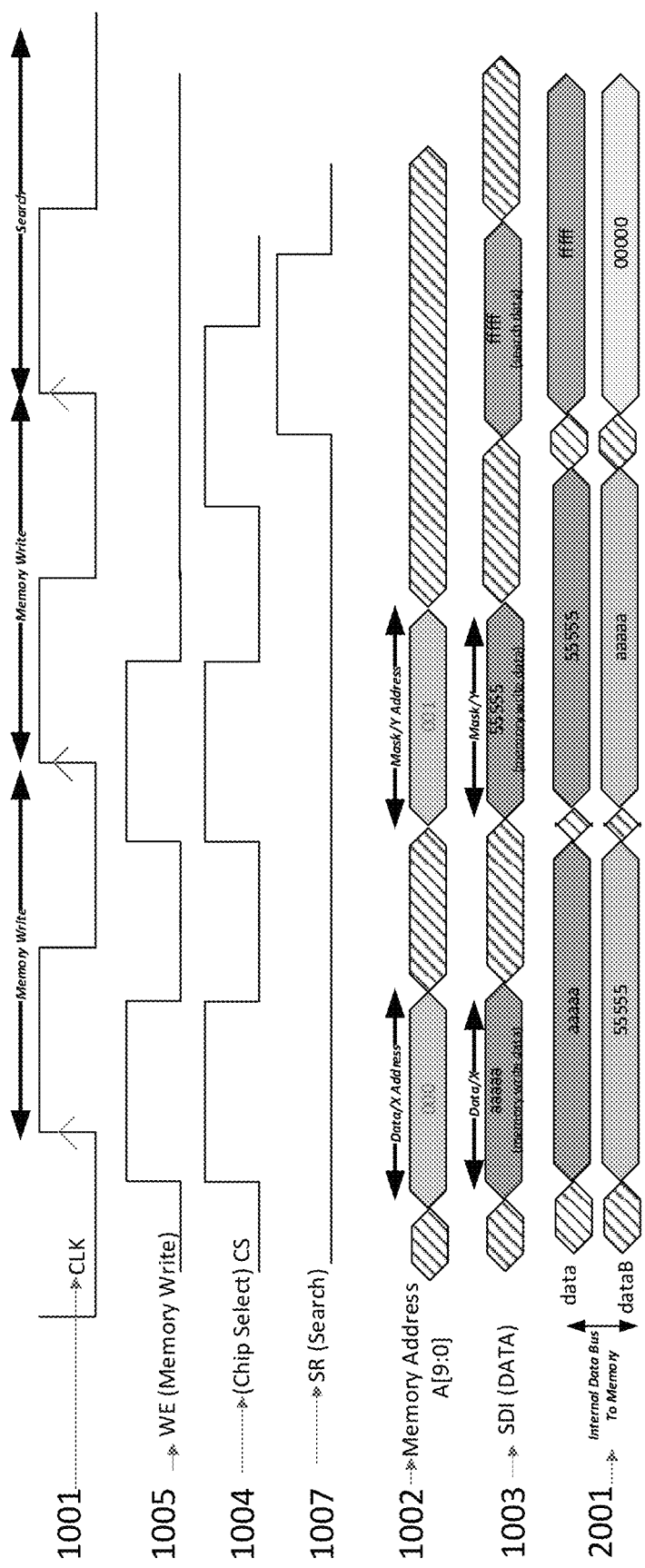
FIG. 2 is an exemplary diagram of a timing diagram for TCAM write and search operation in different cycles, according to conventional systems.

FIG. 2 is an exemplary timing diagram of a TCAM that performs write and search operations in different cycles, for the TCAM of FIG. 1A. FIG. 2 shows memory write operations are performed during the first two clock cycles, and a search operation is performed during a separate clock cycle after the write operations. At no point are both the SR 1007 and WE 1005 both asserted (high logic level, for example) at the same time. In the first memory write cycle, the write enable WE signal 1005 is asserted. This indicates that the TCAM should perform a write operation. In this first memory write cycle, the address to update is represented by '000' (expressed in hexadecimal) through the memory address and the data to write is represented by 'aaaaa' which is input through SDI (DATA) 1003. In this example, the memory is writing the data stored in the X address. In the second memory write cycle, the write enable WE signal 1005 is asserted, indicating that the TCAM should perform a write operation. In this second memory write cycle, the address to update is represented by '001' (expressed in hexadecimal) through the input memory address bus 1002, and the data to write is represented by '55555' which is input through SDI (DATA) 1003. In the second memory write cycle, the memory is writing the mask stored in the Y address. In the next (third) memory clock cycle, the write enable WE signal 1005 is not asserted. Instead, the SR 1007 is asserted, indicating that the TCAM should perform a search operation. In this cycle, the memory address is not used, and the data to search is represented by 'fffff' which is input through SDI (DATA) 1003.

Figure 3:
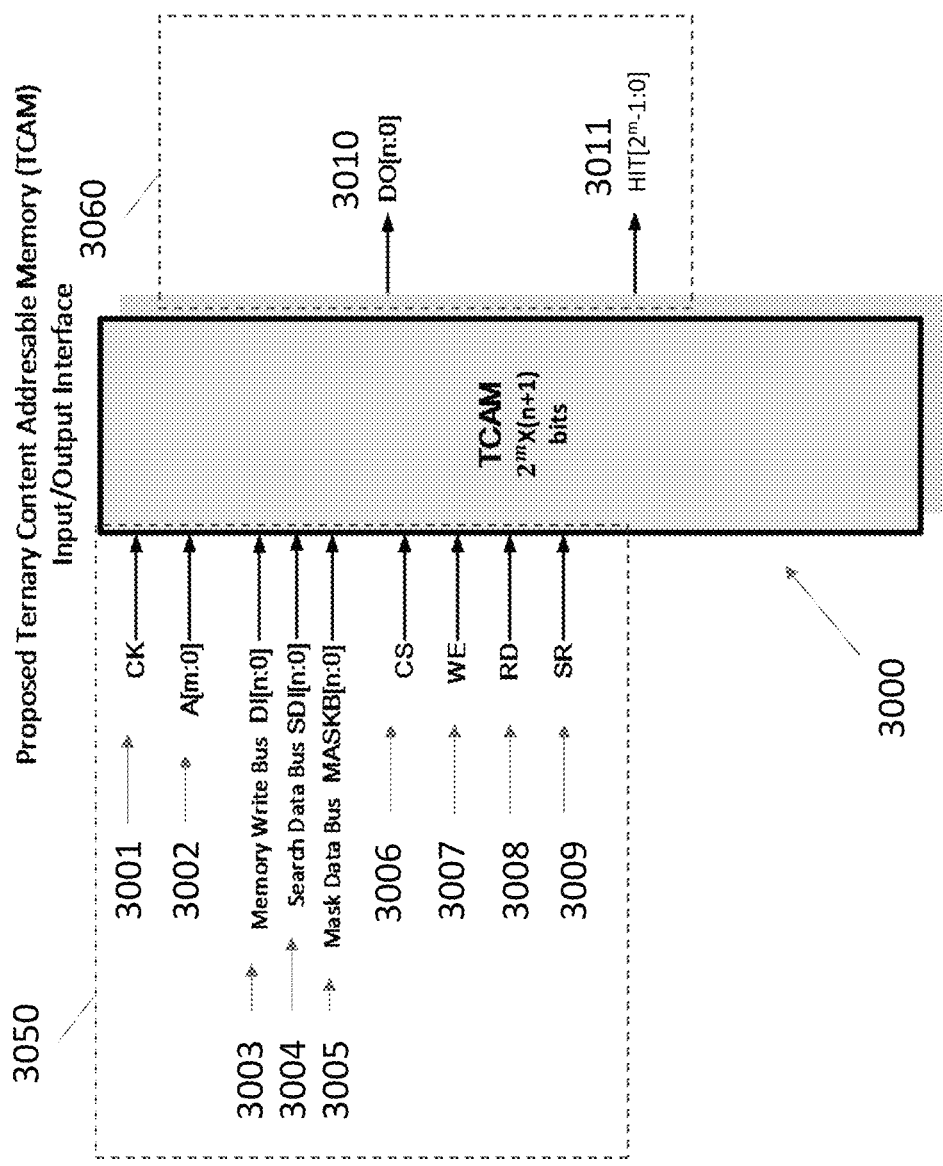
FIG. 3 is an exemplary diagram of a TCAM input/output interface, according to some embodiments.

FIG. 3 is an exemplary diagram of a TCAM input/output interface for a TCAM 3000 that enables searching at the same time as a write operation is performed, according to some embodiments. The TCAM input/output interface includes a TCAM input interface 3050 and a TCAM output interface 3060. More specifically, this architecture is designed to both write and search data in a single clock cycle. The TCAM 3000 may have '$2^{m+1}$' (m>0) number of rows, and 'n+1' columns, each of the rows comprising 'n+1' TCAM cells coupled to a match line. TCAM 3000 receives inputs including clock signal CK 3001, input memory address bus A[m:0] 3002, memory write bus DI[n:0] 3003, input search bus SDI[n:0] 3004, mask data bus MASKB[n:0] 3005, CS 3006, WE 3007, RD 3008 and SR 3009. The TCAM 3000 includes the memory write bus 3003 in addition to the input search bus 3004, whereas the TCAM 1000 does not include the memory write bus 3003. In some embodiments, having separate memory write bus 3003 and search bus SDI 3004 allows for the simultaneous transfer of write data and search data, as opposed to having one SDI, such as SDI 1003 in FIG. 2, which allows only write data or search data to be signaled at a time.

Figure 4:
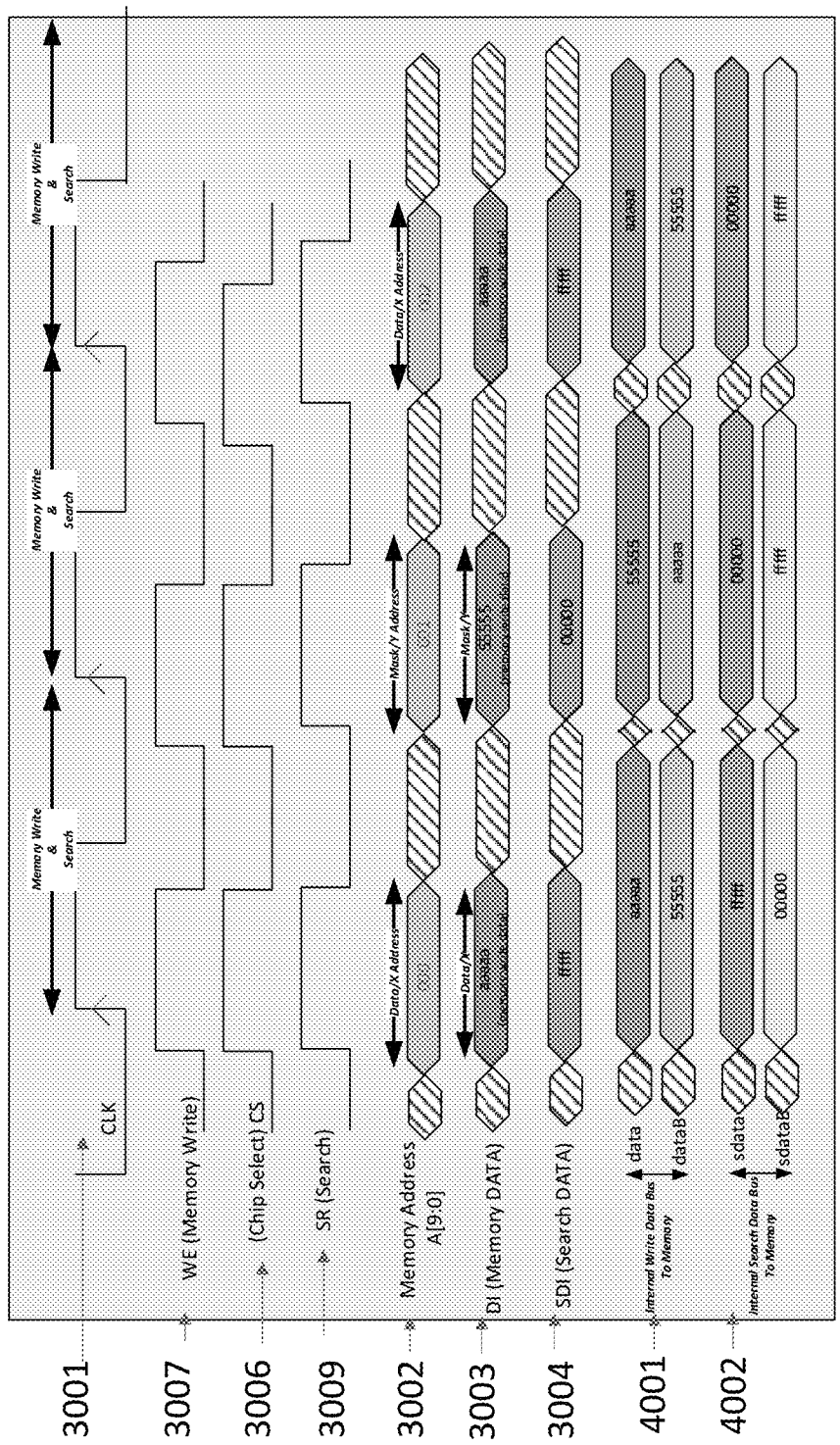
FIG. 4 is an exemplary diagram of a timing diagram for simultaneous TCAM write and search operation, according to some embodiments.

FIG. 4 is an exemplary timing diagram of showing how the TCAM 3000 can perform simultaneous TCAM write and search operation, according to some embodiments. In some embodiments, a TCAM 3000 may perform a simultaneous write operation and search operation by asserting both search enable 3009 (e.g. SR) and memory write enable 3007 (e.g. WE) signal in the same cycle. In this exemplary diagram, search enable 3009 and memory write enable 3007 are both asserted. FIG. 4 also shows internal write data bus to memory 4001 and internal search data bus 4002 which are further described in conjunction with FIG. 5.

As shown in FIG. 4, memory write and memory search are performed simultaneously in each of the three cycles shown. In all three cycles, both SR 3009 and WE 3007 are asserted. For example, in the first cycle, both SR 3009 and WE 3007 are asserted, commanding the memory to perform both a memory search and a memory write. In the first cycle, the address to update is represented by '000' (expressed in hexadecimal) through the memory address 3002 and the data to write is represented by 'aaaaa' which is input through DI (Memory DATA) 3003. In the first cycle, the memory is writing the data stored in the X address. Simultaneously, the data to search is represented by 'fffff' which is input through SDI (Search DATA) 3004. In the second cycle, the SR 3009 and WE 3007 are again both asserted, indicating that the memory should perform both search and write. The address to update is represented by '001' (expressed in hexadecimal) through the memory address 3002 and the data to write is represented by '55555' which is input through DI (Memory DATA) 3003. In this cycle, the memory is writing the mask stored in the Y address. Simultaneously, the data to search is represented by '00000' which is input through SDI (Search DATA) 3004. In the third cycle, the SR 3009 and WE 3007 are again both asserted. The address to update is represented by '002' (expressed in hexadecimals) through the memory address 3002 and the data to write is represented by 'aaaaa' which is input through DI (Memory DATA) 3003. In this example, the memory is writing the data stored in the Y address. Simultaneously, the data to search is represented by 'fffff' which is input through SDI (Search DATA) 3004.

Figure 5:
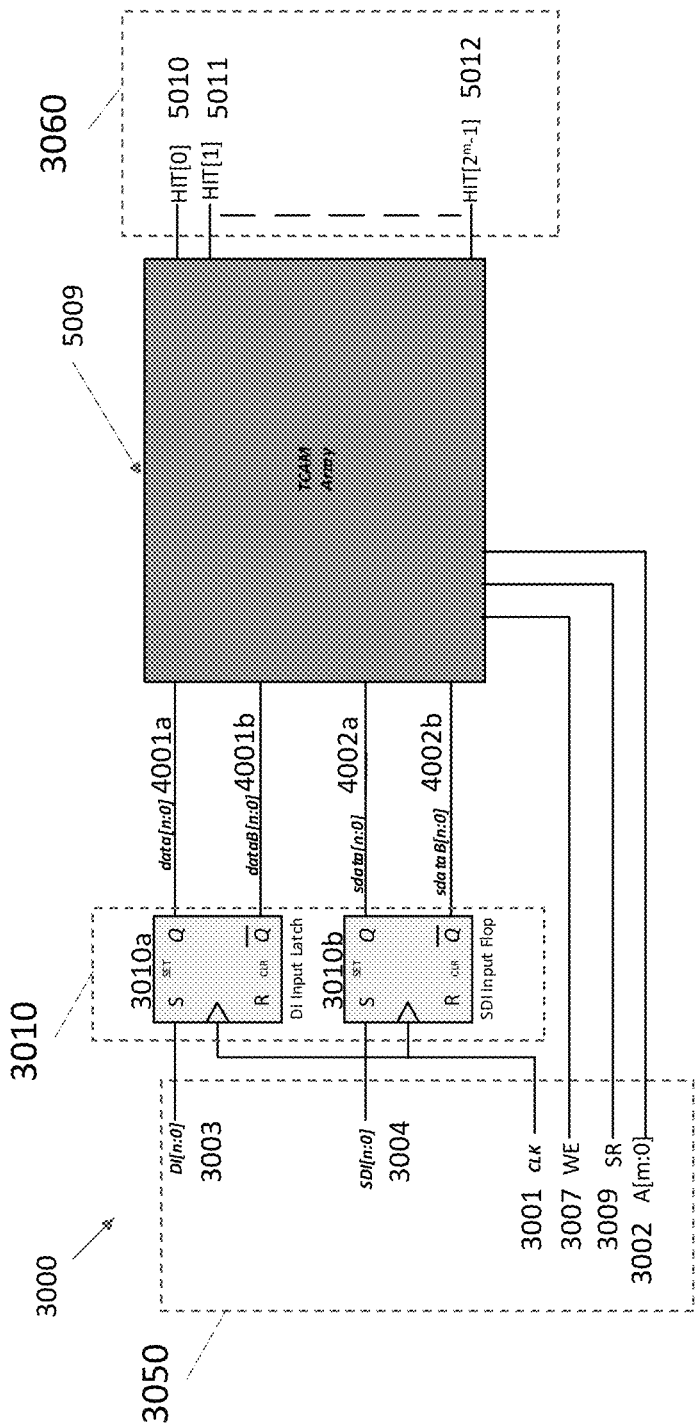
FIG. 5 is an exemplary diagram of a content addressable memory comprising internal write and search data buses to the memory, according to some embodiments.

FIG. 5 is an exemplary diagram of TCAM 3000 showing the TCAM interface, TCAM memory array 5009, and internal write and search data buses to the memory, according to some embodiments. The internal write bus may be used to write into the memory location represented by address bus A[m:0] 3002 and the internal search data bus may be used to search the contents of the TCAM memory array 5009 in the same cycle. The TCAM 3000 may include an input data buffer 3010 that receives data from the TCAM input interface 3050. Input data buffer 3010 may include a storage device 3010*a*, 3010*b*, etc., such as a latch or flip flop, for each row of the TCAM memory array 5009. The input data buffer 3010 may receive and be clocked by CLK 3001. In this example the data inputs of the input data buffer are 3003 and 3004. The outputs of the input data buffer 3010 include an internal write data bus 4001 (e.g. data 4001*a*/dataB 4001*b*) to the memory and an internal search data bus 4002 (e.g. sdata 4002*a*/sdataB 4002*b*) to the memory.

Simultaneous write and search operations may lead to false hits in the case of an entry that is being updated during a given clock cycle. In some embodiments, the CAM device may include added circuitry to disable the HIT output of the entry that is being updated in order to prevent the output of false hits.

Figure 6:
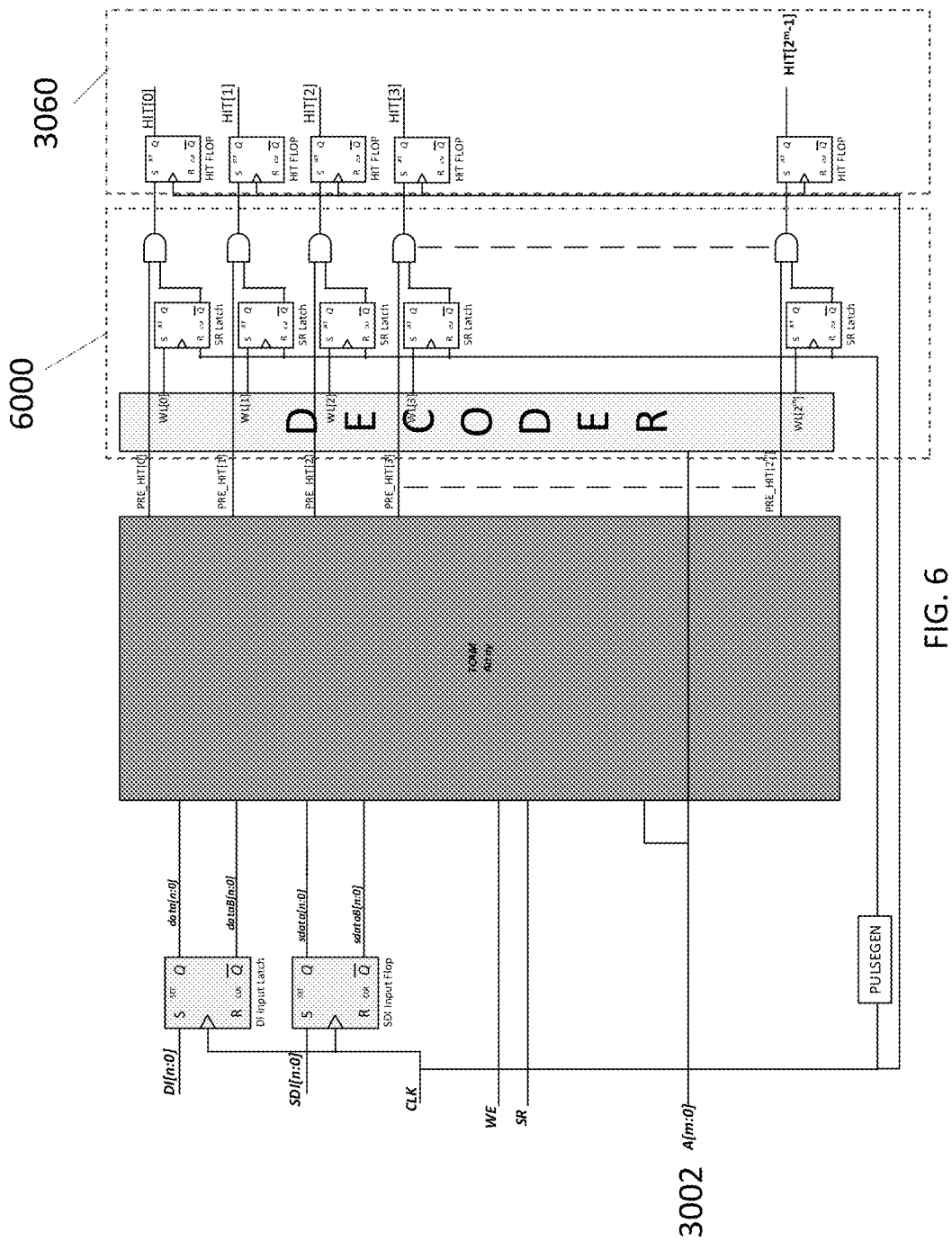
FIG. 6 is an exemplary diagram of a TCAM with circuitry configured to disable HIT outputs, according to some embodiments.

FIG. 6 is an exemplary diagram of a TCAM with circuitry configured to disable HIT outputs, according to some embodiments. In some embodiments, a TCAM 3000, configured to perform write and search operations simultaneously may also comprise the circuitry, such as circuitry 6000, configured to disable HIT outputs of the entry that is being updated. The circuitry 6000 may receive the address 3002 of the entry being updated and ensure the corresponding HIT output of the TCAM memory array is not asserted. There are a number of ways in which this may be performed. An example of such circuitry 6000 is shown in FIG. 6. In this example, circuitry 6000 includes a decoder that receives the address 3002 of the entry being updated and de-asserts the corresponding decoder output WL. After being stored in a latch or flip flop the decoder outputs then proceed to a series of AND gates. The AND gates ensure that any output of the decoder that is asserted ensures corresponding HIT output of the output interface 3060 is not asserted. This prevents a false hit for the TCAM entry that is being updated.

FIG. 7A-B and FIG. 8A-C illustrate embodiments of TCAM architectures and examples of timing diagrams wherein the TCAM is configured to perform write operations—including data writes and mask writes—in a single clock cycle. This architecture may be used in combination with the architecture described above for simultaneous write and search.

Figure 7A:
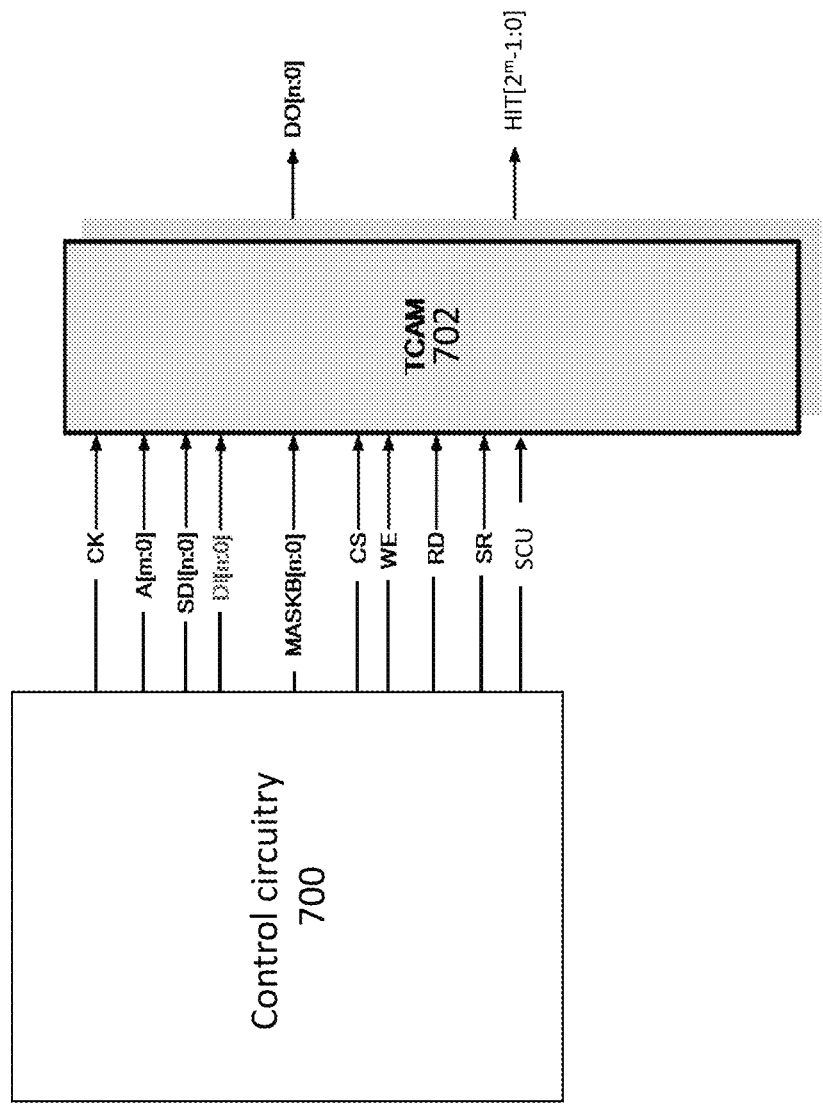
FIG. 7A is a block diagram illustrating a TCAM architecture, in accordance with some embodiments.

FIG. 7A is a block diagram illustrating a TCAM architecture, in accordance with some embodiments. This architecture includes control circuitry 700 and TCAM 702. This architecture is designed to increase the speed of write operations into a TCAM relative to previous implementations. More specifically, this architecture is designed to write a data input and a mask in a single clock cycle. For example, in the same clock cycle, a data input may be written into data row 0 and a mask may be written into mask row 0. The buses of the TCAM are arranged to support write operations of data input and masks in single clock cycles. As shown in FIG. 7A, control circuitry 700 communicates with TCAM 702 using the following buses: CK, A, SDI, DI, MASKB, CS, WE, RD, SCU and SR.

Figure 7B:
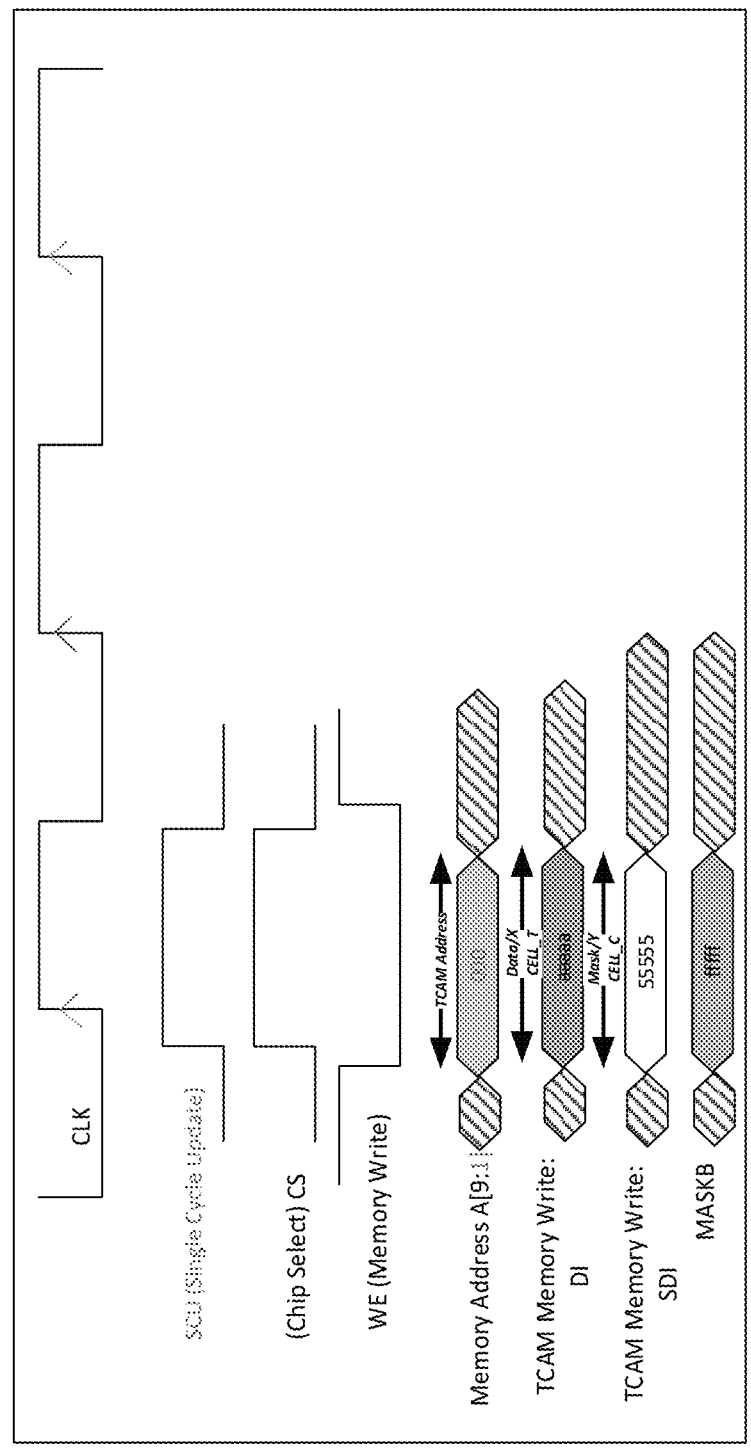
FIG. 7B is a diagram illustrating control signals, according to some embodiments.

FIG. 7B illustrates a representative write operation sequence, in accordance with some embodiments. The figure illustrates the relationship between the signals of buses CLK, SCU, CS, WE, A, DI, SDI and MASKB. When asserted (1-level in this example), signal CS indicates that this TCAM chip has been selected. When asserted (1-level in this example), signal SCU indicates that a single clock operation is to be performed. When de-asserted (0-level in this example), signal WE indicates that regular write operation is not to be performed. Thus, assertion of these three signals indicates that a single clock cycle write operation is to be performed in this TCAM chip.

Signal A provides the address of the row to be written. In this example, the address (expressed in hexadecimals) is "000." The content of signal DI represents the data input to be written into the addressed TCAM data row. In this example, the content of DI is "aaaaa." The content of signal SDI represents the mask to be written into the addressed TCAM mask row. In this example, the content of DI is "55555." In this sequence, both the content of DI and the content of SDI are written in a single clock cycle. During the write operation, the content of signal MASKB ("fffff" in this example) is not considered.

Figure 8A:
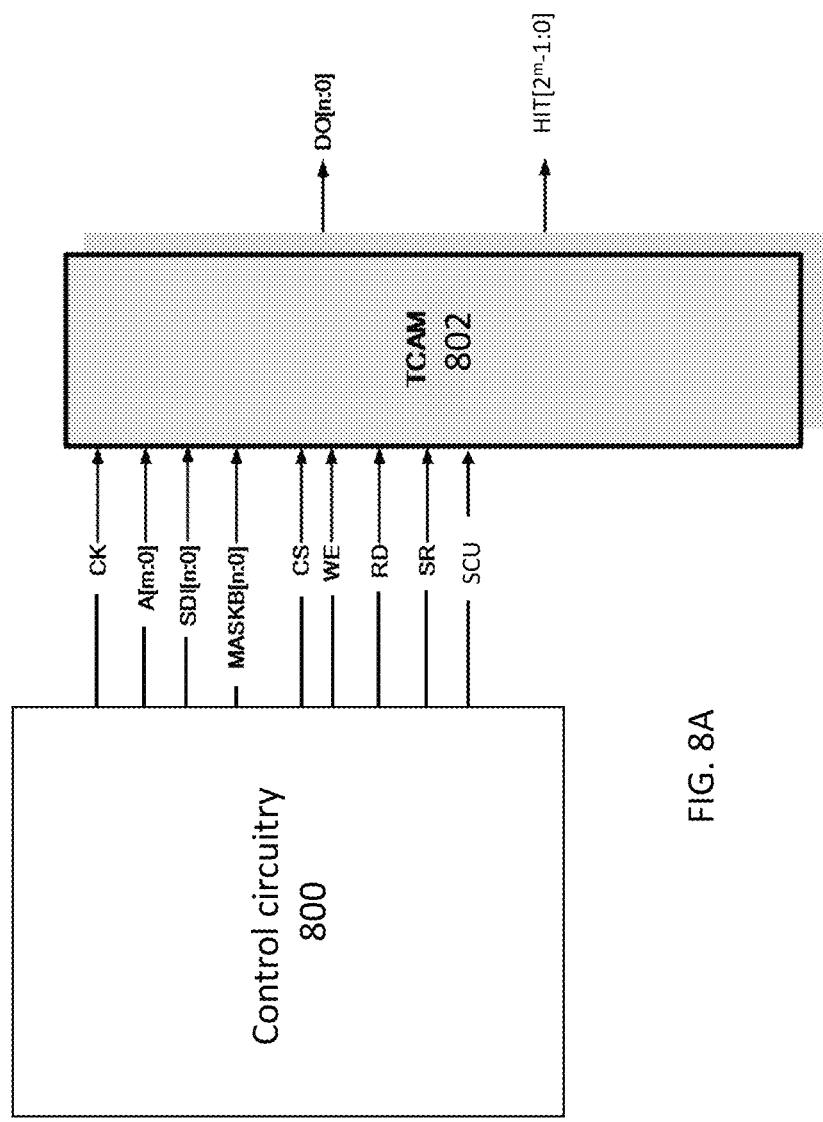
FIG. 8A is a block diagram illustrating another TCAM architecture, according to some embodiments.

FIG. 8A is a block diagram illustrating another TCAM architecture, in accordance with some embodiments. Similar to the architecture of FIG. 7A, this architecture is also designed to write a data input and a mask in a single clock cycle. However, this architecture involves fewer buses than the architecture of FIG. 7A, thereby reducing circuit complexity.

This architecture includes control circuitry 800 and TCAM 802. The buses of the TCAM are arranged to support write operations of data input and masks in single clock cycles. As shown in FIG. 8A, control circuitry 800 communicates with TCAM 802 using the following buses: CK, A, SDI, MASKB, CS, WE, RD, SR, and SCU. It should be noted that, unlike the example of FIG. 7A, this architecture does not include bus DI. In this architecture, both buses SDI and MASKB have a dual function. During a write operation, bus SDI carries the data input to be written and MASKB carries the mask to be written. During a search operation, bus SDI carries the key to be searched and MASKB carries mask bits identifying which column(s) are to be masked (although, alternatively, bus MASKB may carry the key to be searched and SDI may carry mask bits identifying which column(s) are to be masked). In essence, both SDI and MASKB are used in a time-multiplexed fashion. Buses CK, A, CS, WE, RD and SR have the same functions described in connection with FIG. 7A. Output bus DO and HIT also have the same functions described in connection with FIG. 7A.

Figure 8B:
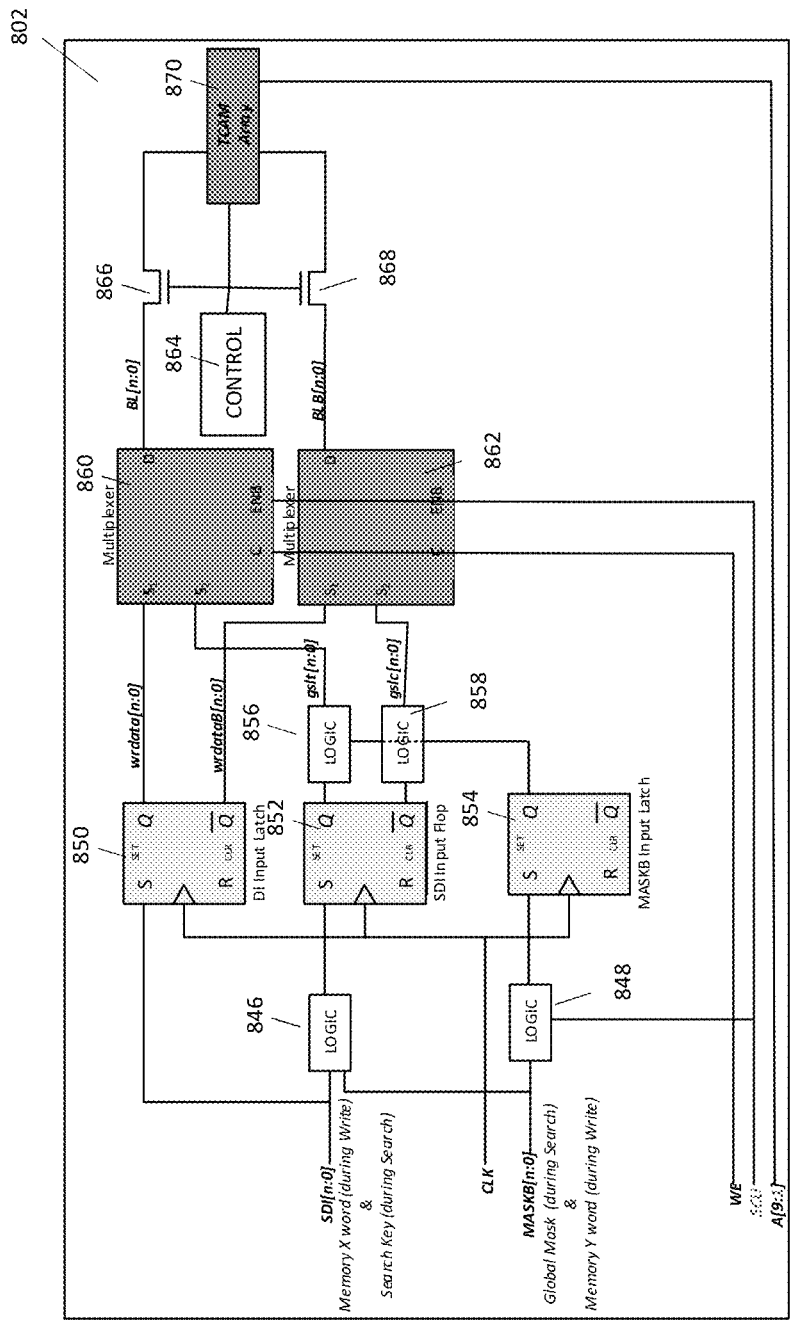
FIG. 8B is a block diagram illustrating an example of an implementation of the TCAM architecture of FIG. 8A, according to some embodiments.

FIG. 8B illustrates an example of TCAM 802, in accordance with some embodiments. In this implementation, TCAM 802 includes flip-flops 850, 852 and 854, logic units 846, 848, 856 and 858, multiplexers 860 and 862, control unit 864 and TCAM array 870. TCAM array 870 may include SRAMs (or other types of memories). TCAM 802 receives signals through buses SDI, MASKB, CLK, WE, SCU and A (as discussed in connection with FIG. 8A). In some embodiments, there may be a circuit similar to that of FIG. 8B for each column of the TCAM array.

Logic unit 846 receives as input the signal of bus SDI and logic unit 848 receives as input the signal of bus MASKB. The signal of pin SCU indicates whether a write operation, including writing of a data input and a mask, is to be performed in a single clock cycle or not. In this example, SCU controls the state of logic unit 848.

Flip-flop 850 receives as input the signal of bus SDI, flip-flop 852 receives as input the output of logic unit 846 and flip-flop 854 receives as input the output of logic unit 848. Clock CLK times the operations of the flip-flops. The outputs of flip-flop 850 are provided as inputs to multiplexers 860 and 862, respectively. The outputs of flip-flop 852 are provided as inputs to logic units 856 and 858, respectively. The state of the logic units 856 and 858 is controlled by the output of flip-flop 854. The signal of bus A indicates the address of the TCAM row to be written or read. During write operations, the signal of bus WE is asserted, which enables use of multiplexers 860 and 862 for write operations. During a write operation, control unit 364 enables writing into TCAM array 870, and the outputs of the flip-flops are written into the TCAM array, via transistors 866 and 868. The signal of bus A determines the address of the row to be written. During a search operation, logic units 856 and 858 mask the search of a particular row, depending on the value of the corresponding mask bit of MASKB.

Figure 8C:
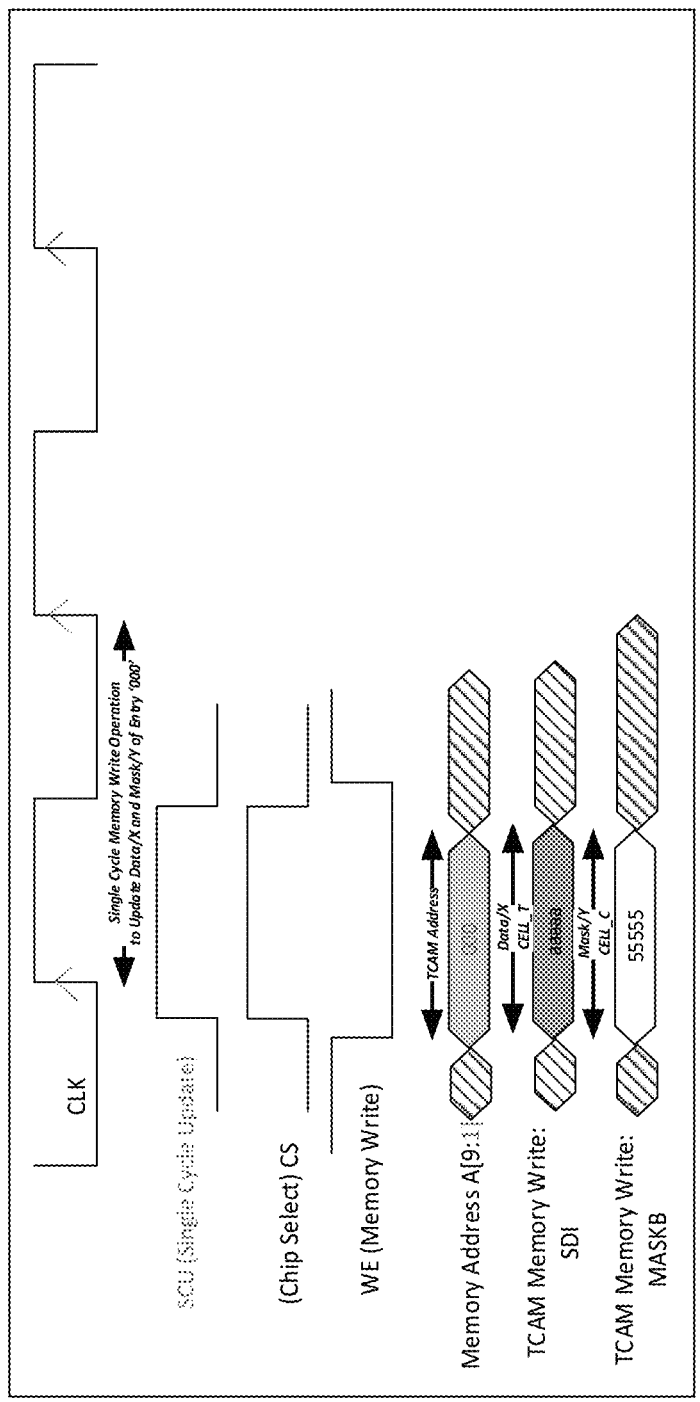
FIG. 8C is a diagram illustrating control signals used in connection with the TCAM architecture of FIG. 8A, according to some embodiments.

FIG. 8C illustrates a representative write operation sequence in connection with the architecture of FIG. 8A, in accordance with some embodiments. The figure illustrates the relationship between the signals of buses CLK, SCU, WE, A, SDI and MASKB. Assertion of SCU, CS and de-assertion of WE indicates that a single clock cycle write operation is to be performed in this TCAM chip.

Signal A provides the address of the row to be written. The content of signal SDI represents the data input to be written into the addressed TCAM data row. The content of signal MASKB represents the mask to be written into the addressed TCAM mask row. In this sequence, both the content of SDI and the content of MASKB are written in a single clock cycle.

According to some embodiments, a content addressable memory (CAM) device can include a CAM array that may have four data input buses. In some embodiments, a primary DATA input (e.g. DI[n:0]) can be used to write into the DATA (X) word of the CAM memory and a secondary data input (e.g. BYTE[n:0]) may be used to write into MASK (Y) word of the CAM array represented by address bus (e.g. A[m:1]) in a single cycle. In some embodiments, a third data input (e.g. SDI[n:0]) and a fourth data input (e.g. MASKB [n:0]) may be used to supply the search key and mask key for the search function respectively. According to some embodiments, a simultaneous memory write operation of a CAM device may be performed in the array to update both DATA and MASK word in a single cycle, while searching its contents by asserting both the search enable (SR) and memory write enable (WE) signals in the same cycle.

Figure 9:
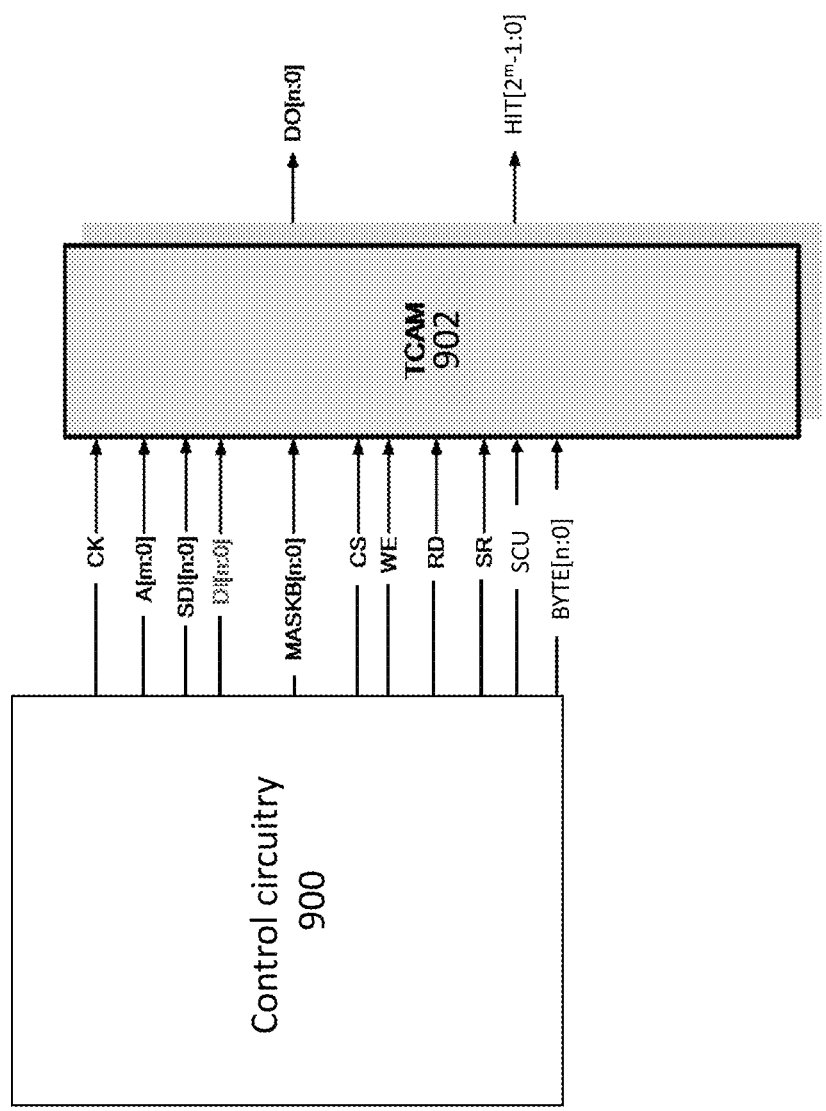
FIG. 9 is a block diagram illustrating another TCAM architecture, in accordance with some embodiments.

FIG. 9 is a block diagram illustrating another TCAM architecture, in accordance with some embodiments. Similar to the architecture of FIG. 7A and 8A, this architecture is also designed to write a data input and a mask in a single clock cycle. However, this architecture also includes 4 data input buses DI[n:0], BYTE[n:0], SDI[n:0], and MASKB[n: 0] as described herein.

This architecture includes control circuitry 900 and TCAM 902. The buses of the TCAM are arranged to support write operations of data input and masks in single clock cycles. As shown in FIG. 9A, control circuitry 900 communicates with TCAM 902 using the following buses: CK, A, SDI, DI, MASKB, CS, WE, RD, SR, SCU, and BYTE. A simultaneous memory write operation of the TCAM 902 may be performed in the array to update both DATA and MASK word in a single cycle, while searching its contents by asserting both the search enable (SR) and memory write enable (WE) signals in the same cycle.

During a write operation, bus DI carries the data input to be written and BYTE carries the mask to be written. During a search operation, bus SDI carries the key to be searched and MASKB carries mask bits identifying which column(s) are to be masked (although, alternatively, bus MASKB may carry the key to be searched and SDI may carry mask bits identifying which column(s) are to be masked). Buses CK, A, CS, WE, RD and SR have the same functions described in connection with FIG. 7A and 8A. Output bus DO and HIT also have the same functions described in connection with FIG. 7A and 8A.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including", "comprising", "having", "containing" or "involving" and variations thereof herein, is meant to encompass the items listed thereafter and equivalents thereof as well as additional items.

The use of "coupled" or "connected" is meant to refer to circuit elements, or signals, that are either directly linked to one another or through intermediate components.

The terms "approximately", "substantially," and "about" may be used to mean within ±20% of a target value in some embodiments, within ±10% of a target value in some embodiments, within ±5% of a target value in some embodiments, and within ±2% of a target value in some embodiments. The terms "approximately" and "about" may include the target value.

What is claimed is:

1. A ternary content addressable memory (TCAM) device comprising:
    an input interface having a first input for receiving first data and a second input for receiving second data;
    a memory configured to write the first data into an address selected row of the memory at the same time that a comparison is performed between the second data and at least one other row of the memory different from the address selected row; and
    circuitry configured to disable a HIT output corresponding to an entry of the memory being updated.

2. The TCAM device of claim 1, wherein the first input is a memory write bus.

3. The TCAM device of claim 1, wherein the second input is a search data bus.

4. The TCAM device of claim 1, wherein the input interface has a third input for receiving a search enable signal and a fourth input for receiving a write enable signal, wherein the memory is configured to write the first data and perform the comparison in response to assertion of the search enable signal at the same time as assertion of the write enable signal.

5. The TCAM device of claim 1, further comprising:
an internal write data bus configured to receive the first data; and
an internal search data bus configured to receive the second data.

6. The TCAM device of claim 5, further comprising an input data buffer including:
a first storage device configured to receive the first data and provide the first data to the internal write data bus; and
a second storage device configured to receive the second data and provide the second data to the internal search data bus.

7. The TCAM device of claim 6, wherein the first storage device comprises a latch or a flip-flop.

8. The TCAM device of claim 1, wherein the circuitry comprises a decoder that receives an address of the entry being updated and a plurality of AND gates.

9. The TCAM device of claim 1, wherein the TCAM device is further configured to perform data and mask write operations in a single clock cycle.

10. The TCAM device of claim 1, wherein the at least one other row comprises a plurality of rows.

11. The TCAM device of claim 10, wherein the plurality of rows comprises all rows of the memory.

12. A method of operating a ternary content addressable memory (TCAM) device, the method comprising:
receiving, at an input interface, first data via a first input and second data via a second input;
writing the first data into an address selected row of a memory at the same time as performing a comparison between the second data and at least one other row of the memory different from the address selected row; and
performing data and mask write operations in a single clock cycle.

13. The method of claim 12, wherein the first input is a memory write bus.

14. The method of claim 12, wherein the second input is a search data bus.

15. The method of claim 12, further comprising:
receiving a search enable signal and a write enable signal; and
writing the first data and performing the comparison in response to assertion of the search enable signal at the same time as assertion of the write enable signal.

16. The method of claim 12, further comprising:
receiving the first data at an internal write data bus; and
receiving the second data at an internal search data bus.

17. The method of claim 16, further comprising:
by a first storage device, receiving the first data and providing the first data to the internal write data bus; and
by a second storage device, receiving the second data and providing the second data to the internal search data bus.

18. The method of claim 17, wherein the first storage device comprises a latch or a flip-flop.

19. The method of claim 12, further comprising disabling a HIT output corresponding to an entry of the memory being updated.

20. The method of claim 19, wherein the disabling is performed by circuitry comprising a decoder that receives an address of the entry being updated and a plurality of AND gates.

21. The method of claim 12, wherein the at least one other row comprises a plurality of rows.

22. The method of claim 21, wherein the plurality of rows comprises all rows of the memory.

* * * * *